United States Patent [19]
Roth et al.

[11] Patent Number: 5,239,276
[45] Date of Patent: Aug. 24, 1993

[54] SUPERCONDUCTIVE MAGNET COIL ARRANGEMENT

[75] Inventors: Gerhard Roth, Karlsruhe; Michael Westphal, Offenbach, both of Fed. Rep. of Germany

[73] Assignee: Bruker Analytische Messtechnik GmbH, Fed. Rep. of Germany

[21] Appl. No.: 665,758

[22] Filed: Mar. 7, 1991

[30] Foreign Application Priority Data

Mar. 8, 1990 [DE] Fed. Rep. of Germany ....... 4007265

[51] Int. Cl.⁵ .......................... H01F 1/00; H01F 7/00; H01F 7/22
[52] U.S. Cl. .................................................. 335/216
[58] Field of Search ............... 335/216, 296–301, 335/304; 324/318, 319, 320; 505/879, 844, 892

[56] References Cited

U.S. PATENT DOCUMENTS

| 4,467,303 | 8/1984 | Laskaris | 335/216 |
| 4,682,134 | 7/1987 | Laskaris | 335/216 |
| 4,758,812 | 7/1988 | Forster | 335/301 |

FOREIGN PATENT DOCUMENTS

| 0118807 | 2/1984 | European Pat. Off. . |
| 0238909 | 3/1987 | European Pat. Off. . |
| 0240935 | 4/1987 | European Pat. Off. . |
| 0285861 | 3/1988 | European Pat. Off. . |
| 0293723 | 5/1988 | European Pat. Off. . |
| 62-202508 | 3/1986 | Japan . |

*Primary Examiner*—Leo P. Picard
*Assistant Examiner*—Raymond Barrera
*Attorney, Agent, or Firm*—Walter A. Hackler

[57] ABSTRACT

A superconductive magnet coil arrangement for generating a homogeneous magnetic field in a volume under examination, comprising a magnet coil having two first windings of a superconductive wire which are disposed adjacent the ends of the magnet coil and which are supported on a hollow supporting body, and comprising further at least one additional winding of a superconductive wire which is arranged in the area between the first windings and which is supported by the supporting body, is characterized by the fact that at least one of the additional windings is arranged on a winding core mounted on the supporting body and the fixation securing the winding against axial displacement occupies an area in length of the winding core shorter than the length of the winding arranged on the winding core. It is achieved in this manner that the pressure produced by Lorentz forces in the supporting body is kept off the rest of the winding.

6 Claims, 2 Drawing Sheets

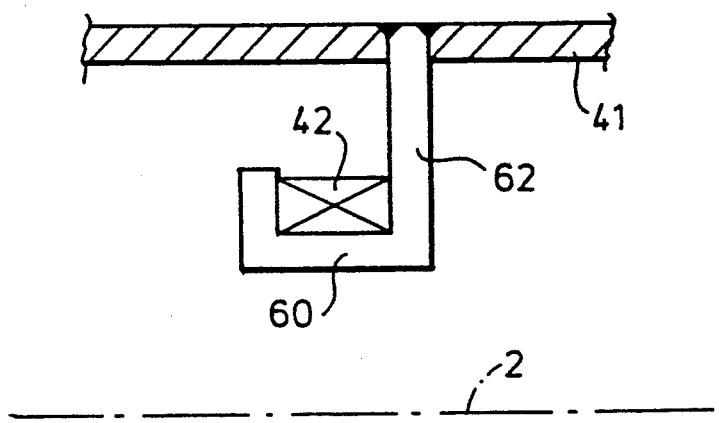
Fig. 7
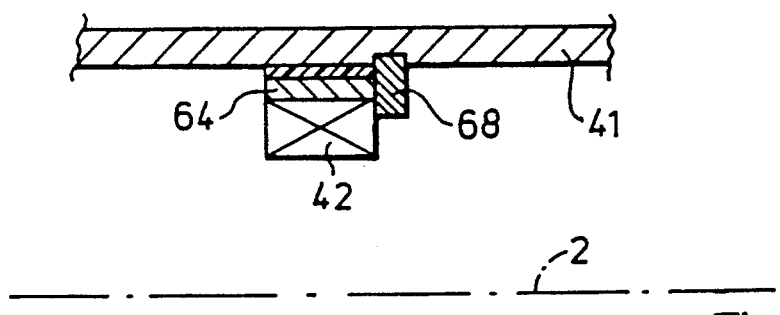
Fig. 8
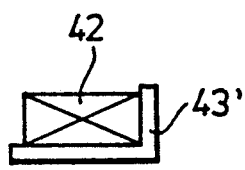 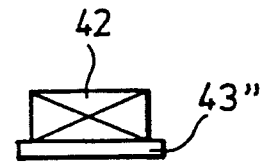
Fig. 9 Fig. 10

SUPERCONDUCTIVE MAGNET COIL ARRANGEMENT

BACKGROUND OF THE INVENTION

The present invention relates to a superconductive magnet coil arrangement for generating a homogeneous magnetic field in a volume under examination, comprising a magnet coil having two first windings of a superconductive wire which are disposed adjacent the ends of the magnet coil and which are supported on a hollow supporting body enclosing the volume under examination, and comprising further at least one additional winding of a superconductive wire which is arranged in the area between the first windings and which is supported by the said supporting body, the windings being fixed against displacement in the axial direction.

A magnet coil of this kind has been known for example from EP-A-0 293 723 and EP-A-0 285 861. The supporting body, which displays a substantially cylindrical shape, comprises a plurality of winding chambers each containing one winding made from a superconductive wire. Flanges left between the winding chambers fix the windings rigidly in the axial direction. From EP-A-0 118 807 (GE) it has been known to arrange the windings radially inside a supporting body made from aluminium, and to provide low annular stops in order to thereby prevent the windings, i.e. the entire winding packages, from being displaced due to magnetic forces.

In the case of superconductive coils of the kind described above, Lorentz forces, which act on the superconductive wire in the axial direction of the coil, are encountered due to the existing radial components of the magnetic field. These forces sum up in each winding, which comprises a plurality of turns. At the axial inner end of the winding chamber, the forces are then transmitted to the flange and, via the supporting body, to the next winding chamber in the form of a pressure. Such a transmission of pressures to other winding chambers is not encountered in a disturbing manner only in such cases where a maximum of two windings are provided and arranged at an axial distance one from the other. The axial pressure sums up towards the middle of the coil and leads to a reduction in length of the supporting body in the area between the two axially outer windings, as a result of the axial pressures encountered. The highest forces, however, arise at the coil ends because there the radial components of the magnetic field reach their maximum if the current has the same intensity throughout.

It has been found by experiments that the pressure in the winding core must not exceed a certain maximum value which is predetermined by the properties of the material of the wire and by the winding technique. If the pressure gets excessively high, a coil of this type can no longer be operated at very high field strengths because the process of building up a high magnetic field will be terminated, during charging of the coil, at some point or other by instable displacements of the winding turns. For a series of homogeneous coils with relatively high field strengths it is the pressure which limits the magnetic field strength. The described transmission of the axial pressure over the full length of the winding is also encountered in the case of the before-mentioned EP-A-0 118 807, because of an intimate interference fit existing between the windings, which are not delimited by lateral walls of the winding chambers, and the supporting body.

SUMMARY OF THE INVENTION

It is, therefore, desirable to reduce the influence of the pressure on the superconductive wire so as to achieve improved operating safety and/or higher field strengths, with unaltered homogeneity and field strength.

The present invention achieves this object by the fact that at least one of the additional windings is arranged on a winding core mounted on the supporting body and that the fixing means securing the said winding against axial displacement occupies an area in length of the winding core shorter than the winding arranged on the winding core.

In order to facilitate understanding, it will be assumed for the purposes of the following explanations that the windings are placed on the outside of a structure carrying them, for example the supporting body or the winding core. It is understood, however, that the invention can be applied also to such arrangements where the particular core of a winding is arranged on the radial outside of the winding.

In the case of the invention, if an area which is delimited in the axial direction of the winding core and which is shorter than the length of the winding and located in full within the axial length of the winding, is rigidly connected with the supporting body, whereas the remaining parts of the winding core are connected with the supporting body in a non-rigid way, a reduction in length of the supporting body, due to the axial pressures caused by the magnetic fields, can be transmitted only to that area in length where the rigid connection exists, and may there possibly lead to a reduction in length of the winding body at its radial outer surface which is in contact with the winding. This already reduces the influence which the reduction in length of the supporting body has on the winding of the superconductive wire. The shorter the area in length over which a rigid connection exists between the winding core and the supporting body, and the greater the distance between the surface of the winding core which carries the coil and the said rigid connection or fixing means, the less important is the influence of the pressure on the winding arranged on the winding core.

The invention also extends to embodiments where the winding core is rigidly connected with the supporting body via at least 2 axially spaced fixing means. It is understood that in this case the spacing between the fixing means is comprised in the before-mentioned area in length, the decisive factor for the reduction in length of the winding core being the distance between the forward and the rear ends of the single fixing means or of the foremost and the rearmost fixing means, if a plurality of such fixing means are provided.

If at least part of the area of the winding core which is fixed to the supporting body is located outside of the length of the winding, in the axial direction, then only the fixing area which is inside the length of the winding may possibly lead to a variation in length of the area of the winding core which is available for the coil. This, therefore, also reduces the influence of the pressure on the winding.

If the fixation of the winding core is located completely outside the coil, the winding on the winding core is not influenced at all by the pressure prevailing in the supporting body.

But even if the fixation is located inside the winding area, viewed in the axial direction, the influence which the pressure prevailing in the supporting body has on the winding core will be completely eliminated if, according to one embodiment of the invention, a stop extending substantially in transverse direction to the sense of the displacement to be prevented is used for fixing the winding core against displacements in the axial direction. This is because in this case the axial length of the fixation is equal to zero and the pressure prevailing in the supporting body can no longer result in a variation in length of the winding core.

The pressure building up in each winding, due to radial components of the magnetic field, cannot be eliminated by the invention. It may be of advantage, in particular for constructional reasons, to apply the invention also to one or both of the outermost coils neighboring the ends of the coil arrangement.

There is the possibility to connect the winding core with the supporting body only at the point of fixation and to leave a certain distance between the remaining parts of the winding core and the winding body. For reasons of stability, however, it may be appropriate to have the remaining parts of the winding core, which are not to be fixed on the supporting body against longitudinal displacements, also supported by the supporting body. This is effected, according to one embodiment of the invention, by an arrangement where the winding core is seated on the supporting body in a low-friction relationship. This low-friction contact, which is intended to prevent pressures from being transmitted to the winding core in an undesirable way, may be achieved in particular by a friction-reducing coating consisting of a suitable material, in particular a plastic material, applied to the supporting body and/or to the winding core, or by suitable selection of the materials used and/or by suitable surface treatment.

According to certain embodiments of the invention, the winding core may consist substantially of a part which is in contact with the said winding only at the latter's radial (radially inward or radially outward) delimitation. In this case, any possible displacement of the winding relative to the winding core must be prevented by an interference fit and/or by filling the connection with a plastic compound and/or by providing stops or in some other suitable manner. The winding core may instead form a winding chamber, i.e. may have at least one wall extending perpendicularly to the longitudinal direction of the coil and having a height at least equal to the winding thickness in the radial direction, said wall defining the winding space.

In particular in the case of those embodiments of the invention where a stop is provided which prevents any movements of the winding core, in the meaning of the invention, only in a single sense of displacement (normally towards the middle of the coil), it may be convenient or necessary to prevent any undesired displacement of the winding core in the opposite direction in order to obtain well defined assembly conditions and, in particular, to exclude undesirable movements of the winding core if the coil axis extends in the vertical direction. In such cases, it is provided according to one embodiment of the invention that the winding core is supported on the one hand by the before-mentioned stop, which can be regarded as absolutely rigid with respect to the forces generated by the radial components of the magnetic field, and on the other hand additionally by another stop which delimits the movement of the winding core in the other direction and which, although preventing any undesired displacement of the winding core, is not strong enough as to transmit pressures on the winding core that would lead to a disturbing reduction in length of the supporting body, if this stop and the first-mentioned stop should come to fix between them the full length or part of the length of the winding body. The additional stop will, therefore, be described hereafter as soft stop.

A winding lying in the center of the longitudinal extension of a magnetic coil arrangement is, generally, exposed only to extremely low radial components of the magnetic field so that such a winding is itself not exposed to high pressures that may arise inside its own winding core. Since in addition, thanks to the invention, no axial pressures are transmitted to it from other windings, it is rendered possible by the invention to structure a winding near its coil center for homogenization purposes in particular to provide it with What is known as notches, i.e. gaps or areas of reduced current density in the cross-sectional volume occupied by the winding. The term supporting body as used herein is meant to describe both hollow cylindrical supporting bodies and supporting bodies which are composed of a plurality of parallel bars extending in the axial direction in order to avoid eddy currents.

Other features and advantages of the invention will appear from the following description of certain embodiments of the invention by reference to the drawing, which shows certain details which are essential to the invention, and from the claims. It is understood that each of the features of the invention may be implemented in any embodiment of the invention either alone or in any combination thereof.

BRIEF DESCRIPTION OF THE DRAWINGS

FIG. 7 shows a simplified longitudinal section through another embodiment of the invention;

FIG. 8 shows a simplified longitudinal section through another embodiment of the invention; and FIGS. 9 and 10 show modifications of FIG. 4.

DESCRIPTION OF THE PREFERRED EMBODIMENTS

Figure 1:
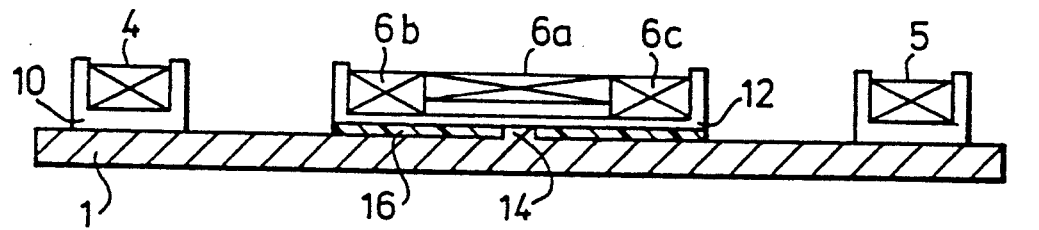
FIG. 1 shows a longitudinal section through a first embodiment comprising a superconductive magnet coil arrangement with a total of three windings.

In FIG. 1, a tubular supporting body 1 with an axis 2 can be seen with windings 4 and 5, respectively, provided on its two end portions, and a winding 6 with partial windings 6a, 6b, 6c, arranged in its central area. The windings 4 and 5 are of absolutely identical design, being wound around a winding core 10 which consists of walls extending perpendicularly to the axis 2 and a tubular connection piece and which are fixed on the supporting body 1 over their full length. The central winding 6 is wound around a winding core 12, which likewise consists of side walls and a tubular connection piece, but which is fixed on the supporting body 1 against displacement in both directions solely by its axially central area 14, over its full circumference. The length of the area 14 is so short that the winding 6 will not be influenced by the compression or shortening of this area 14 due to the pressures exerted by the windings 4 and 5 and acting in the axial direction inside the supporting body 1. The areas of the winding core 12 outside the area 14 are supported on the supporting body 1 in low-friction relationship so that the supporting body 1 is permitted at these points to move in the axial direction relative to the winding core 12. The low-friction contact is achieved by a coating 16 consisting of a low-friction plastic material which is applied upon the radial inner side of the winding core 12. As indicated in FIG. 1, the winding 6 is structured with a view to generating the most homogeneous magnetic field possible; in the illustrated example it displaces a profiled cross-section, which means that the winding height is reduced in length in the central area (partial winding 6a).

The three coils 4, 5 and 6 serve for generating a stationary magnetic field in a nuclear magnetic resonance spectrometer or a nuclear magnetic resonance tomograph. The winding system provided for generating the stationary magnetic field may contain yet other windings. In operation, the arrangement illustrated in FIG. 1 is located inside a cryostat filled with liquid helium.

Figure 2:
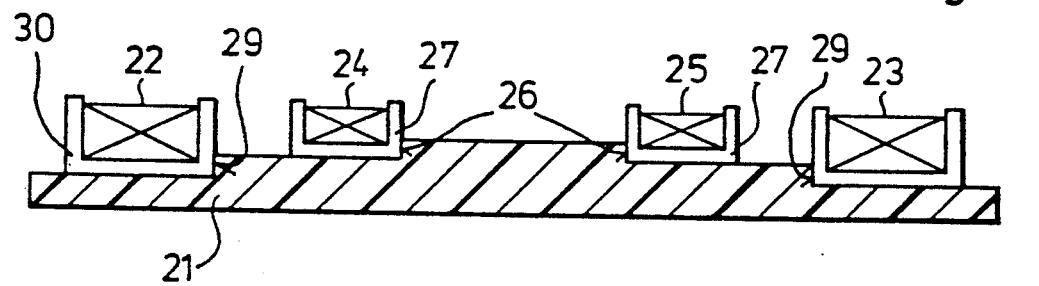
FIG. 2 shows a similar representation of a magnet coil arrangement with a total of four windings.

The arrangement illustrated in FIG. 2 comprises a total of four windings, namely two windings 22 and 23 arranged near the ends of the supporting body, which is indicated in this case by reference numeral 21, and two windings 24 and 25 arranged at equal spacings from the windings 22 and 23, respectively, towards the axial center of the supporting body 21. The outside of the supporting body 21 is stepped in such a way as to form annular shoulders or stops 26 which prevent the windings 24 and 25, each of which is arranged on a winding core 27, from moving towards the axial center of the arrangement, i.e. towards each other, and so that additional annular shoulders or stops 29 prevent the windings 22 and 23, which are likewise arranged on winding cores 30, from moving towards each other. The windings 24 and 25 are fixed in the winding cores 27, whereas the winding cores 27 are supported on the supporting body 21 in low-friction relationship—not illustrated in the drawing—and are prevented from moving towards each other only by the stops 26. In the case of this illustrative example, the winding cores 30, too, are supported on the supporting body 21 in low-friction relationship.

The windings 22 and 23 located at the ends of the coil arrangement are, just as the windings 4 and 5 in the embodiment illustrated in FIG. 1, exposed to particularly strong radial components of the magnetic field built up by the entire coil arrangement. Due to the direct current flowing through the windings, the windings 22 and 23 tend to move towards each other, thereby producing forces at the stops 29 which lead to a certain reduction in length of the supporting body 21 which consists of aluminium. The reduction in length of the supporting body leads to an axially directed relative displacement between the radial outer surface of the supporting body 21 and the radial inner surface of the winding core 27, in the area of the winding cores 27, which relative movement is, however, not transmitted as pressure to the winding core and to the windings 24 and 25, due to the low-friction fit of the winding cores 27 on the supporting body 21. The reduction in length of the supporting body 21 only has the result that the distance of the windings 24 and 25 is somewhat reduced. This change in distance, which is also encountered in the case of the known arrangements, is taken into account already when designing the coil system.

FIGS. 3 to 6 only show the way in which a single coil is fixed on the supporting body. In these cases, any movement of the respecting winding, together with its winding core, to the right is prevented by a stop which is designed as a ring fixed on the supporting body 41.

Figure 3:
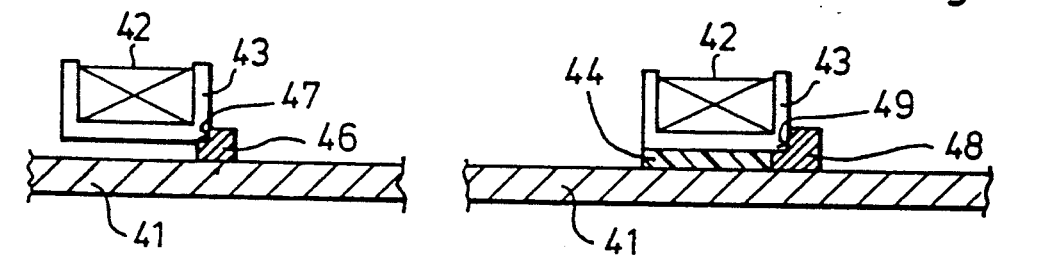
FIGS. 3 to 6 show longitudinal sections through several possible arrangements where the movement of a winding core carrying a winding is limited by a stop in one direction.

The winding arranged in the winding core 43 in FIG. 3 is identified by reference numeral 42. A ring 46 made from aluminium is rigidly connected with the supporting body 41. The ring 46 comprises a shoulder 47 of low height, which does not, in the radial direction, extend to the beginning of the winding 42, and the winding core 43 rests against the shoulder 47 forming a stop so that it cannot move to the right. Generally, the winding core 43 does not rest against the supporting body 41, but is arranged at a radial distance therefrom.

Figure 4:
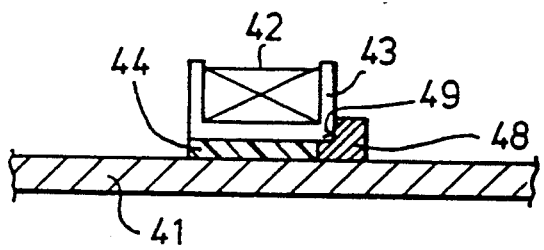

In FIG. 4 the winding core 43 which, just as the embodiment discussed above, comprises lateral walls is provided with a friction-reducing coating 44 and is thereby supported on the supporting body 41 in low-friction relationship. In the case of the arrangement illustrated in FIG. 4, the shoulder 49 formed by the ring 48 forming the stop extends a little further in radially outward direction. In both cases (FIGS. 3 and 4) the ring 46 or 48, respectively, supports the right end portion of the winding core against radial movement towards the supporting body 41, but the rings 46 and 48 do not extend into the area of the coil 42 in axial direction.

Figure 5:
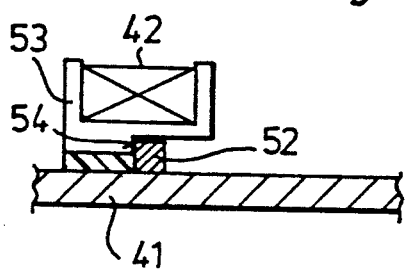

In the case of the arrangement illustrated in FIG. 5, the ring 52 forming the stop is axially located in full inside the coil 42. The winding core 53 is provided on its radially inner side with a step 54, which is in contact with the ring 52 constituting a stop for this step 54 and, thus, for the winding core 53. At the left of the ring 52, the winding core 53 is again supported on the supporting body 41 in low-friction relationship.

Figure 6:
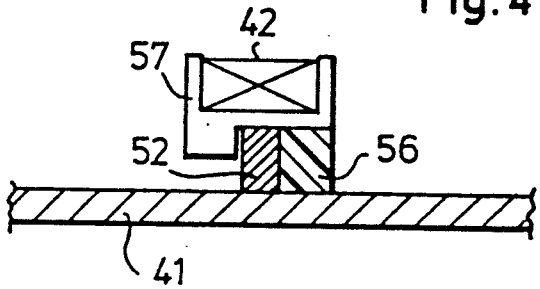

In the case of the arrangement illustrated in FIG. 6, another ring 56 made from a low-friction plastic material is provided at the right of the ring 52 for supporting the winding core 57, in low-friction relationship, via the latter's area right of the ring 52.

The before-mentioned way of supporting a winding by a so-called soft stop may also be effected by rings fixed on the supporting body 41 or by stops which do not extend over the full circumference of the supporting body 41. For a winding having a weight of 1,000 kg where the before-mentioned stop, which is to prevent any axial displacement towards the coil center, has to counteract a force generated by magnetic effects in the range of, for example, 300,000N, this ring may, for example, have the following dimensions: If the supporting body 41 has an outer diameter of 120 cm, the ring has an outer diameter of 130 cm and a length in the axial direction of 10 cm, and consists of an aluminium alloy. The corresponding soft stop is formed by a total of 12 blocks fixed on the supporting body 41, which blocks are made from an aluminium alloy having a height of 1 cm, a width (measured in the circumferential direction of the supporting body 41) of 5 cm and a length in the axial direction of 10 cm. When forces generated by magnetic effects occur, these soft stops will deform sufficiently so that the pressure produced by them inside the winding core, in its longitudinal direction, is sufficiently small as not to effect any notable change in length of the winding core and, thus, any notable disturbance of the winding.

In the case of the arrangement illustrated in FIG. 7, a winding 42 is arranged radially inside the supporting body 41, but is itself wound around a coil core 60 which is arranged on the radial inside of the winding and which is connected with the supporting body via a projection 62 extending in radial outward direction.

In the case of the arrangement illustrated in FIG. 8, the coil 42 is wound inside a radially outward winding core 64 in the form of a tube which is seated in the supporting body 41 in low-friction relationship and is supported at its end facing the coil center by a ring 68 which acts as a stop.

FIG. 9 shows a modification of FIG. 4 where that lateral wall of the coil core 43', which anyway does not absorb any forces, is missing.

In all embodiments described heretofore (with the exception of FIG. 8), the lateral walls of the winding cores transmit to the respective stops of the supporting body part of the forces produced by the individual turns of the respective winding. If the winding as such is very stable in itself, for example when the gaps are filled with a suitable compound, the winding core may be designed without the lateral walls and may then consist only of a tubular part 43", as indicated in FIG. 10 which is likewise a modification of FIG. 4. In order to reduce eddy currents, the tubular part may, just as the supporting body, be provided with recesses extending in the longitudinal direction.

Where heretofore one winding was provided only, for example the outermost winding in the axial direction, several windings may be provided according to the invention. So, it is possible to subdivide the beforementioned outermost winding in two windings, for example, which have the same number of turns and which are arranged at a certain axial distance one from the other. According to the general principle of the invention, at least the axially inner one of these two windings is then supported only by points so as to relieve it from the pressure of the axially outer winding. In addition, the pressure arising in each winding itself is also reduced due to the smaller number of turns.

Preferably, all windings are superconductive, as in the illustrated embodiment of the invention.

We claim:

1. Superconductive magnet coil arrangement for generating a homogeneous magnetic field in a volume under examination, comprising a magnet coil having two first windings of a superconductive wire which are disposed adjacent the ends of the magnet coil and which are supported on a hollow supporting body enclosing the volume under examination, and comprising further additional windings of a superconductive wire disposed between the two first windings and supported by the supporting body, and, means for fixing the additional windings to the support body so that variation in length of the support body due to magnetic forces produced by said two first windings, do not cause a variation in a length of the additional windings.

2. Superconductive magnet coil arrangement for generating a homogeneous magnetic field in a volume under examination, comprising a magnet coil having two first windings of a superconductive wire which are disposed adjacent the ends of the magnet coil and which are supported on a hollow supporting body enclosing the volume under examination, and further comprising additional windings of a superconductive wire disposed between the two first windings and supported by the supporting body, and means for fixing the first windings and the additional windings against displacement in an axial direction along the supporting body, the additional windings being disposed on a winding core mounted on the supporting body, the means for fixing comprising a fixation, securing the winding core against axial displacement, having a length, measured along the winding core, shorter than the length of the additional windings along the winding core, said fixation being located axially inside of the additional windings.

3. Superconductive magnet coil arrangement for generating a homogeneous magnetic field in a volume under examination, comprising a magnet coil having two first windings of a superconductive wire which are disposed adjacent the ends of the magnet coil and which are supported on a hollow supporting body enclosing the volume under examination, and further comprising additional windings of a superconductive wire disposed between the two first windings and supported by the supporting body, and means for fixing the first windings and the additional windings against displacement in an axial direction along the supporting body, the additional windings being disposed on a winding core mounted on the supporting body, the means for fixing comprising a fixation, securing the winding core against axial displacement, having a length, measured along the winding core, shorter than the length of the additional windings along the winding core, said winding core being seated on said supporting body in a low-friction relationship, the low-friction relationship being achieved by a friction-reducing coating.

4. Superconductive magnet coil arrangement for generating a homogeneous magnetic field in a volume under examination, comprising a magnet coil having two first windings of a superconductive wire which are disposed adjacent the ends of the magnet coil and which are supported on a hollow supporting body enclosing the volume under examination, and further comprising additional windings of a superconductive wire disposed between the two first windings and supported by the supporting body, and means for fixing the first windings and the additional windings against displacement in an axial direction along the supporting body, the additional windings being disposed on a winding core mounted on the supporting body, the means for fixing comprising a fixation, securing the winding core against axial displacement, having a length, measured along the winding core, shorter than the length of the additional windings along the winding core, said winding core comprising a part having contact with the windings only at a radial delimiting surface thereof.

5. Arrangement according to claim 2, wherein at least part of the fixation is located axially outside of the additional windings, and the fixation includes a stop, extending substantially in transverse direction to the sense of the displacement to be prevented, for fixing the winding core against displacements in the axial direction, the winding core being seated on the said supporting body in a low-friction relationship, the low-friction relationship being achieved by a friction-reducing coating, and the winding core comprises a part having contact with the additional windings only at a radial delimiting surface thereof.

6. Arrangement according to claim 2, wherein at least part of the fixation is located axially outside of the additional windings and the fixation includes a stop extending substantially in transverse direction to the sense of the displacement to be prevented, for fixing the winding core against displacements in the axial direction, the winding core being seated on the said supporting body in a low-friction relationship, the low-friction relationship being achieved by a friction-reducing coating, and the winding core comprises a winding chamber having at least one wall extending perpendicularly to the longitudinal direction of the said supporting body.

* * * * *